(12) United States Patent
Lu et al.

(10) Patent No.: US 12,543,299 B2
(45) Date of Patent: Feb. 3, 2026

(54) ELECTROMAGNETIC SHIELDING APPARATUS

(71) Applicant: TAIWAN SEMICONDUCTOR MANUFACTURING COMPANY LTD., Hsinchu (TW)

(72) Inventors: Shao-Tse Lu, Taoyuan (TW); Yu-Min Tai, Miaoli County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 188 days.

(21) Appl. No.: 18/348,382

(22) Filed: Jul. 7, 2023

(65) Prior Publication Data

US 2025/0011978 A1 Jan. 9, 2025

(51) Int. Cl.
*H05K 9/00* (2006.01)
*D02G 3/04* (2006.01)
*D02G 3/44* (2006.01)

(52) U.S. Cl.
CPC .............. *H05K 9/0043* (2013.01); *D02G 3/04* (2013.01); *D02G 3/441* (2013.01); *H05K 9/009* (2013.01); *D10B 2101/20* (2013.01); *D10B 2401/16* (2013.01)

(58) Field of Classification Search
CPC ........ D02G 3/04; D02G 3/441; H05K 9/0043; H05K 9/009
See application file for complete search history.

(56) References Cited

U.S. PATENT DOCUMENTS

| | | | | |
|---|---|---|---|---|
| 3,288,175 A | * | 11/1966 | Valko | D03D 15/533 57/256 |
| 3,877,965 A | * | 4/1975 | Broadbent | C23C 18/285 2/243.1 |
| 3,986,530 A | * | 10/1976 | Maekawa | A41D 31/26 D5/47 |
| 4,375,009 A | * | 2/1983 | Fearnside | H01B 11/1033 174/109 |
| 4,684,762 A | * | 8/1987 | Gladfelter | D03D 15/00 174/DIG. 11 |
| 6,963,031 B2 | * | 11/2005 | Gladfelter | D03D 1/0043 174/74 A |
| 7,697,304 B2 | * | 4/2010 | Naito | H05K 9/0096 361/818 |

(Continued)

FOREIGN PATENT DOCUMENTS

CN 207369522 U * 5/2018
JP 2002299883 A * 10/2002

OTHER PUBLICATIONS

Translation CN 207369522.*
Translation JP 2002299883.*

*Primary Examiner* — Shaun R Hurley
(74) *Attorney, Agent, or Firm* — WPAT LAW; Anthony King

(57) ABSTRACT

An electromagnetic shielding apparatus is provided. In one embodiment, the shielding apparatus, comprises a plurality of first ply yarns and a plurality of second ply yarns. Each of the first ply yarns comprises a plurality of metal filaments, and each of the second ply yarns comprises a plurality of metal filaments. The first ply yarns and the second ply yarns are interwoven with each other to form a first knitted layer, and the first knitted layer is configured to deform to accommodate an object received therein.

20 Claims, 18 Drawing Sheets

(56) References Cited

U.S. PATENT DOCUMENTS

| | | | |
|---|---|---|---|
| 10,939,595 B1* | 3/2021 | Abouhatsira | H05K 9/0001 |
| 11,083,120 B2* | 8/2021 | Simoens | H05K 9/0098 |
| 11,576,289 B2* | 2/2023 | Abdelmoula | D03D 15/67 |
| 2008/0287022 A1* | 11/2008 | Dhawan | D02G 3/38 |
| | | | 442/229 |
| 2013/0277101 A1* | 10/2013 | Judy | H05K 9/0043 |
| | | | 174/378 |
| 2014/0177196 A1* | 6/2014 | Kumar | H05K 9/0052 |
| | | | 361/816 |
| 2015/0345053 A1* | 12/2015 | Skarbovig | G08B 13/126 |
| | | | 87/13 |
| 2016/0309626 A1* | 10/2016 | Simoens-Seghers | |
| | | | D03D 1/0043 |
| 2020/0032430 A1* | 1/2020 | Verstraeten | D03D 1/0058 |
| 2021/0012925 A1* | 1/2021 | Omae | H05K 9/0098 |
| 2021/0378341 A1* | 12/2021 | Cronk | A42B 1/245 |
| 2022/0392668 A1* | 12/2022 | Visser | H01B 11/1869 |

* cited by examiner

ELECTROMAGNETIC SHIELDING APPARATUS

BACKGROUND

When electronic components, such as sensors, driver devices, or control elements, are in operation, they may be affected by external interference or self-generated interference, which can impact their performance. Users typically resort to replacing the electronic components or using conductive materials like aluminum foil to shield the components. Another approach is to employ anti-interference devices at the signal or power lines of the device. However, these methods often yield unsatisfactory results.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
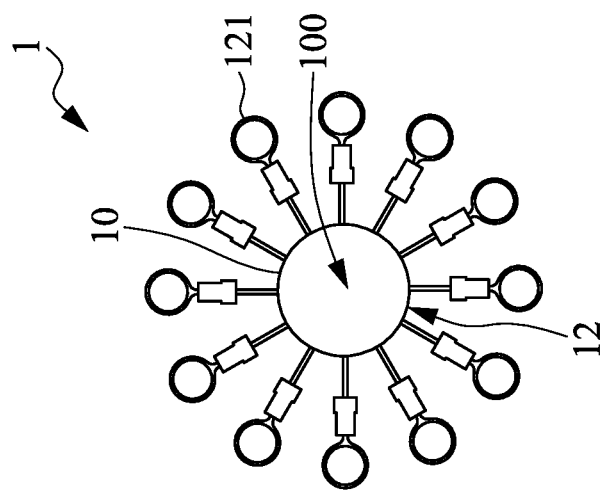
FIG. 1B is a schematic side view of the shielding apparatus, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features; the scope of the disclosure being defined by the claims appended hereto.

When electronic components such as sensors, driver devices, or control elements are in operation, they can be affected by external interference or self-generated interference, which can disrupt their functioning. In such cases, it is necessary to provide an electromagnetic shielding device to create electromagnetic isolation between the electronic components and the interfering energy.

Present disclosure provides a shielding apparatus which achieves electromagnetic shielding, effectively blocking the penetration or exit of external electromagnetic fields. The shielding apparatus may include a conductive material. When an external electromagnetic wave encounters the shielding apparatus, it may induce electric currents on the surface of the conductive material. These induced currents, known as eddy currents, generate their own electromagnetic fields that oppose the incoming field. According to Faraday's law of electromagnetic induction, the change in the magnetic field due to the eddy currents creates a counteracting electromagnetic field that cancels out the external field.

The conductive material used in the construction of the shielding apparatus acts as a barrier to electromagnetic waves. When external electromagnetic waves encounter the shielding apparatus, they induce eddy currents on the surface of the conductive material of the shielding material. These eddy currents generate their own electromagnetic field that is opposite to the external electromagnetic field, thus counteracting the energy of the electromagnetic waves. That is, increasing the surface area of the conductive material of the shielding apparatus allows for more eddy currents to be formed, resulting in a stronger counteractive electromagnetic field and therefore enhancing the shielding effect.

Figure 1A:
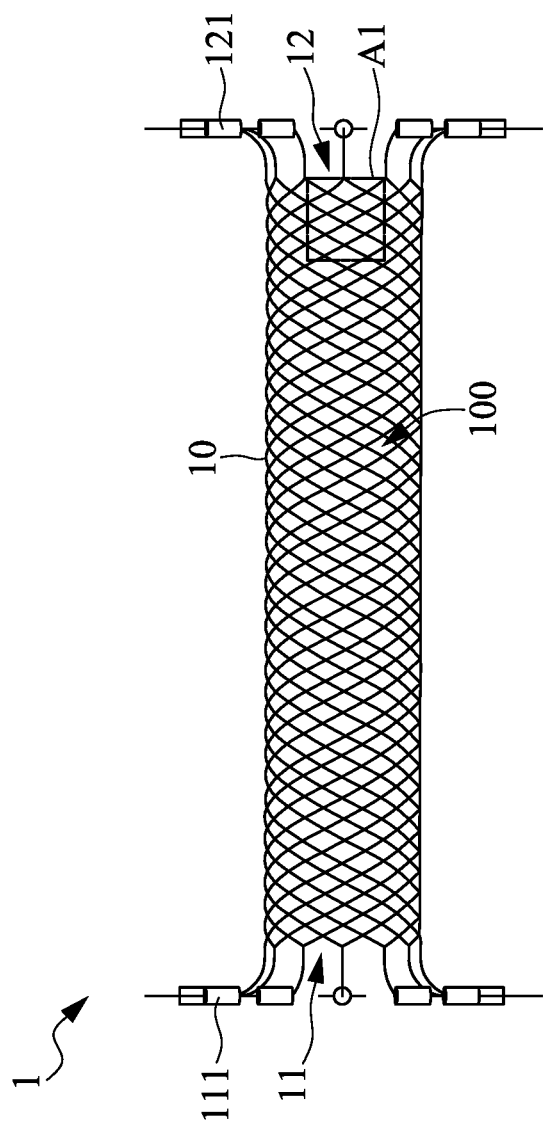
FIG. 1A is a schematic front view of the shielding apparatus, in accordance with some embodiments of the present disclosure.

FIG. 1A is a schematic front view of the shielding apparatus 1, in accordance with some embodiments of the present disclosure. FIG. 1B is a schematic side view of the shielding apparatus 1, in accordance with some embodiments of the present disclosure. The shielding apparatus 1 may include a mesh structure 10, an opening 11 and another opening 12 opposite to the opening 11. As shown in FIG. 1A and FIG. 1B, the overall appearance of the shielding apparatus is substantially cylindrical in shape. In some embodiments of the present disclosure, the mesh structure 10 includes at least one conductive material. Referring to FIG. 1A and FIG. 1B, the mesh structure 10 of the shielding apparatus 1 define an inner space 100 which is configured to accommodate an electronic component that needs to be shielded. Moreover, the electronic component may enter the inner space 100 defined by the mesh structure 10 through the opening 11 or 12. The opening 11 may include a stretch mechanism 111 and thus the opening 11 is opened and closed by the stretch mechanism 111. The opening 12 may include a stretch mechanism 121 and thus the opening 12 is opened and closed by the stretch mechanism 121. When the stretch mechanism 111, 112 is loosened, the opening 11, 12 may be opened. That is, the electronic component that needs to be shielded may be put into the inner space 100 defined by the mesh structure 10 through the opening 11, 12. When the stretch mechanisms 111 and 112 are pulled tight, the openings 11 and 12 may be closed and the inner space becomes mostly closed off. That is, the electronic component that needs to be shield may be enclosed in the inner space 100 or surrounded by the mesh structure 10 when the electronic component enters into the inner space 100 and the opening 11, 12 are closed. Moreover, even when the opening 11, 12 is closed by the stretch mechanisms 111, 112, a passage will still be retained for passing through the opening 11, 12. Thus, when the electronic component that needs to be shield is received in the inner space 100 and the openings 11 and 12 are closed, a portion of the electronic component, such as electrical connection wire or power cable, may pass through the passage of the opening 11 or 12 and connect the device outside the shielding apparatus 1.

Given the above, the mesh structure 10 is configured to receive and enclose the electronic component that needs to be shield in the inner space 100 defined by the mesh structure 10. Since the mesh structure 10 may include the conductive material, thus the mesh structure 10 may shield external electromagnetic waves, allowing the electronic components inside the enclosed inner space 100 of the mesh structure 10 to be unaffected by electromagnetic interference caused by external electromagnetic waves. Further, because the opening 11, 12 of the mesh structure 10 retains the passage even when in the closed state, the electrical connection cable of the electronic component may pass through this passage to connect with external devices outside the shielding apparatus. Therefore, during the use of the shielding apparatus 1, the electronic component can continue to operate.

Moreover, the mesh structure 10 of the shielding layer 1 may be flexible and/or deformable. Thus, the mesh structure 10 may deform to properly enclose or surround the electronic component that need to be shield and to accommodate the electronic component in the inner space 100 of the mesh structure 10.

Figure 1C:
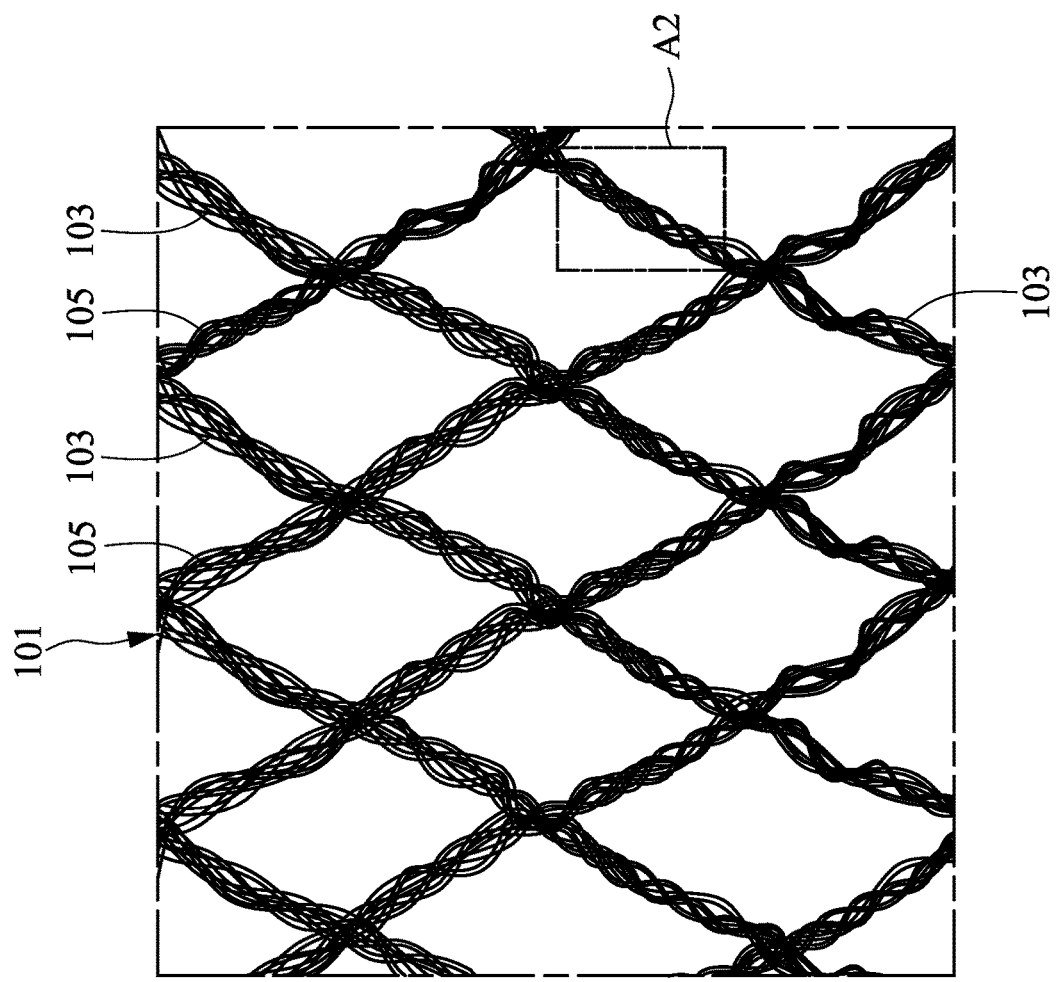
FIG. 1C is an enlarged view of portion "A1" illustrated in FIG. 1A.

FIG. 1C is an enlarged view of portion "A1" illustrated in FIG. 1A. In some embodiments of the present disclosure, the mesh structure 10 include a single knitted layer 101. In some embodiments of the present disclosure, the knitted layer 101 may include a plurality of elongated multilayer structure 103 and a plurality of elongated multilayer structure 105. In some embodiments of the present disclosure, the multilayer structure 103 is a ply yarn. In some embodiments of the present disclosure, the multilayer structure 103 is a conductive yarn. Further, the elongated multilayer structures 103 are spaced apart from each other and extend parallel to each other, substantially in one direction. In some embodiments of the present disclosure, the multilayer structure 105 is a ply yarn. In some embodiments of the present disclosure, the multilayer structure 105 is a conductive yarn. The elongated multilayer structures 105 are spaced apart from each other and extend parallel to each other, substantially in another direction, which is different from the direction which the elongated multilayer structures 103 extend along. That is, the elongated multilayer structures 103 and the elongated multilayer structures 105 may be interwoven with each other or combined with each other to form the knitted layer 101. Since the knitted layer 101 of the mesh structure 10 may be formed by interweaving the elongated multilayer structures 103 and the elongated multilayer structures 105 with each other, the mesh structure 10 may be flexible.

Figure 1D:
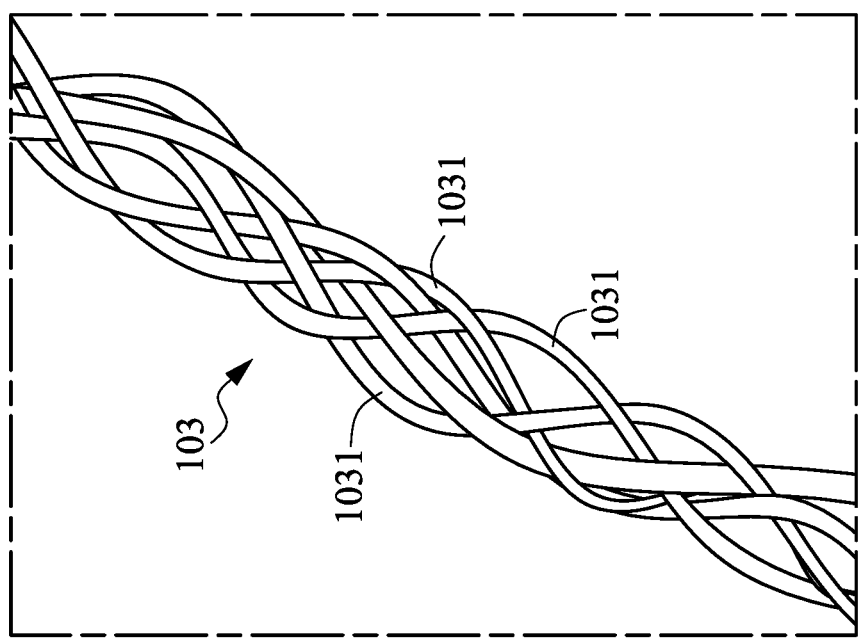
FIG. 1D is an enlarged view of portion "A2" illustrated in FIG. 1C.

FIG. 1D is an enlarged view of portion "A2" illustrated in FIG. 1C. Especially it illustrates an embodiment of the elongated multilayer structure 103 as shown in FIG. 1C.

Referring to FIG. 1D, the elongated multilayer structure 103 may include a plurality of conductive layers 1031 which are combined with each other. In some embodiments of the present disclosure, a number of the conductive layers 1031 in each elongated multilayer structure 103 is at least 20. In some embodiments of the present disclosure, the multilayer structure 103 is a ply yarn, and the conductive layer 1031 is a metal filament. In some embodiments of the present disclosure, the multilayer structure 103 is a conductive yarn, and the conductive layer 1031 is a conductive filament. The conductive layer 1031 may include at least one metal material, wherein the metal material may include aluminum and/or nickel. Further, each of the conductive layer 1031 may have its own outer surface. Since the elongated multilayer structure 103 may include a plurality of the conductive layers 1031 and each of the conductive layer 1031 may have its own outer surface, the conductive surface of the elongated multilayer structure 103 is increased. Therefore, the elongated multilayer structure 103 may have a significantly large surface area of conductive surface. In some embodiments of the present disclosure, the structure of the elongated multilayer structure 105 is the same as or similar to the structure of the elongated multilayer structure 103. That is, the elongated multilayer structure 105 may have a significantly large surface area of conductive surface as well. Moreover, since the knitted layer 101 of the mesh structure 10 may be formed by interweaving the elongated multilayer structures 103 and the elongated multilayer structures 105 with each other, the mesh structure 10 may have a significantly large surface area of conductive surface accordingly. Therefore, the electromagnetic shielding effectiveness of the shielding apparatus 1 may be significantly increased.

Figure 1E:
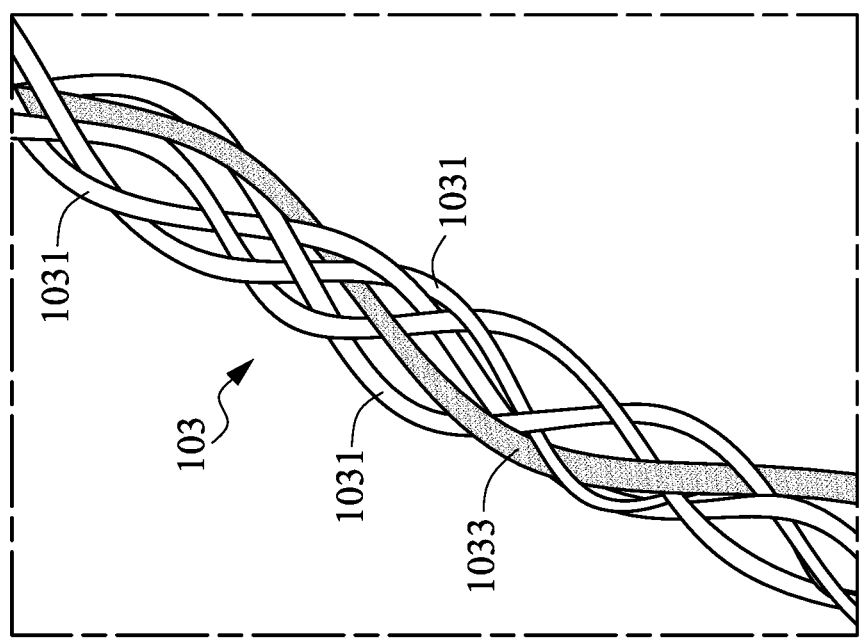
FIG. 1E is an enlarged view of portion "A2" illustrated in FIG. 1C.

FIG. 1E is an enlarged view of portion "A2" illustrated in FIG. 1C. Especially it illustrates another embodiment of the elongated multilayer structure 103 as shown in FIG. 1C.

Referring to FIG. 1E, the elongated multilayer structure 103 may include a plurality of conductive layers 1031 which are combined with each other. In some embodiments of the present disclosure, a number of the conductive layers 1031 in each elongated multilayer structure 103 is at least 20. In some embodiments of the present disclosure, the multilayer structure 103 is a ply yarn, and the conductive layer is a metal filament. In some embodiments of the present disclosure, the multiplayer structure 103 is a conductive yarn, and the conductive layer 1031 is a conductive filament. The conductive layer 1031 may include at least one metal material, wherein the metal material may include aluminum and/or nickel. Moreover, the elongated structure 103 may further include at least one non-conductive layer 1033. In some embodiments of the present disclosure, the non-conductive layer 1033 is a non-conductive filament. The at least one non-conductive layer 1033 may be combined with the conductive layers 1031 and thus the at least one non-conductive layer may be a part of the multilayer structure 103. Further, each of the conductive layer 1031 may have its own outer surface. Since the elongated multilayer structure 103 may include a plurality of the conductive layers 1031 and each of the conductive layer 1031 may have its own outer surface, the conductive surface of the elongated multilayer structure 103 is increased. Therefore, the elongated multilayer structure 103 may have a significantly large surface area of conductive surface. In some embodiments of the present disclosure, the structure of the elongated multilayer structure 105 is the same as or similar to the structure of the elongated multilayer structure 103. That is, the elongated multilayer structure 105 may have a significantly large surface area of conductive surface as well. Moreover, since the knitted layer 101 of the mesh structure 10 may be formed by interweaving the elongated multilayer structures 103 and the elongated multilayer structures 105 with each other, the mesh structure 10 may have a significantly large surface area of conductive surface accordingly. Therefore, the electromagnetic shielding effectiveness of the shielding apparatus 1 may be significantly increased.

Figure 2B:
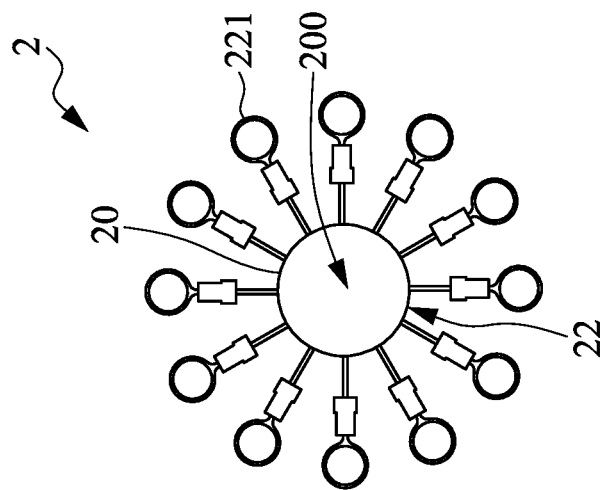
FIG. 2B is a schematic side view of the shielding apparatus, in accordance with some embodiments of the present disclosure.
Figure 2A:
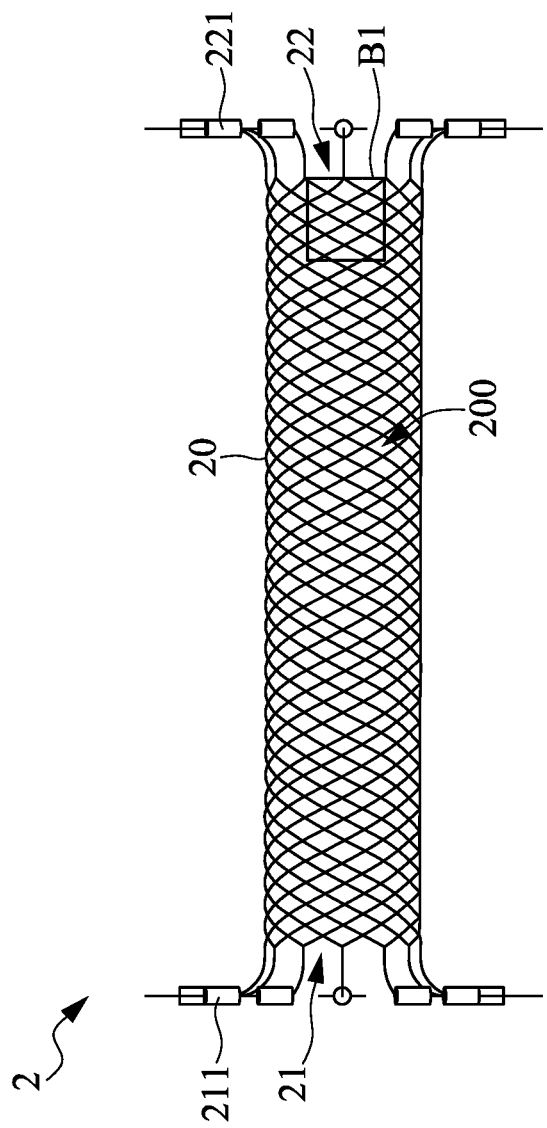
FIG. 2A is a schematic front view of the shielding apparatus, in accordance with some embodiments of the present disclosure.

FIG. 2A is a schematic front view of the shielding apparatus 2, in accordance with some embodiments of the present disclosure. FIG. 2B is a schematic side view of the shielding apparatus 2, in accordance with some embodiments of the present disclosure. The shielding apparatus 2 may include a mesh structure 20, an opening 21 and another opening 22 opposite to the opening 21. As shown in FIG. 2A and FIG. 2B, the overall appearance of the shielding apparatus 2 is substantially cylindrical in shape. In some embodiments of the present disclosure, the mesh structure 20 includes at least one conductive material. Referring to FIG. 2A and FIG. 2B, the mesh structure 20 of the shielding apparatus 2 define an inner space 200 which is configured to accommodate an electronic component that needs to be shielded. Moreover, the electronic component may enter the inner space 200 defined by the mesh structure 10 through the opening 21 or 22. The opening 21 may include a stretch mechanism 211 and thus the opening 21 is opened and closed by the stretch mechanism 211. The opening 22 may include a stretch mechanism 221 and thus the opening 22 is opened and closed by the stretch mechanism 221. When the stretch mechanism 211, 212 is loosened, the opening 21, 22 may be opened. That is, the electronic component that needs to be shielded may be put into the inner space 200 defined by the mesh structure 20 through the opening 21, 22. When the stretch mechanisms 211 and 212 are pulled tight, the openings 21 and 22 may be closed and the inner space becomes mostly closed off. That is, the electronic component that needs to be shield may be enclosed in the inner space 200 or surrounded by the mesh structure 20 when the electronic component enters into the inner space 200 and the opening 21, 22 are closed. Moreover, even when the opening 21, 22 is closed by the stretch mechanisms 211, 212, a passage will still be retained for passing through the opening 21, 22. Thus, when the electronic component that needs to be shield is received in the inner space 200 and the openings 21 and 22 are closed, a portion of the electronic component, such as electrical connection wire or power cable, may pass through the passage of the opening 21 or 22 and connect the device outside the shielding apparatus 2.

Given the above, the mesh structure 20 is configured to receive and enclose the electronic component that needs to be shield in the inner space 200 defined by the mesh structure 20. Since the mesh structure 20 may include the conductive material, thus the mesh structure 20 may shield external electromagnetic waves, allowing the electronic components inside the enclosed inner space 200 of the mesh structure 20 to be unaffected by electromagnetic interference caused by external electromagnetic waves. Further, because the opening 21, 22 of the mesh structure 20 retains the passage even when in the closed state, the electrical connection cable of the electronic component may pass through this passage to connect with external devices outside the shielding apparatus. Therefore, during the use of the shielding apparatus 2, the electronic component can continue to operate.

Moreover, the mesh structure 20 of the shielding layer 2 may be flexible and/or deformable. Thus, mesh structure 20 may deform to properly enclose or surround the electronic component that need to be shield and to accommodate the electronic component in the inner space 200 of the mesh structure 20.

Figure 2C:
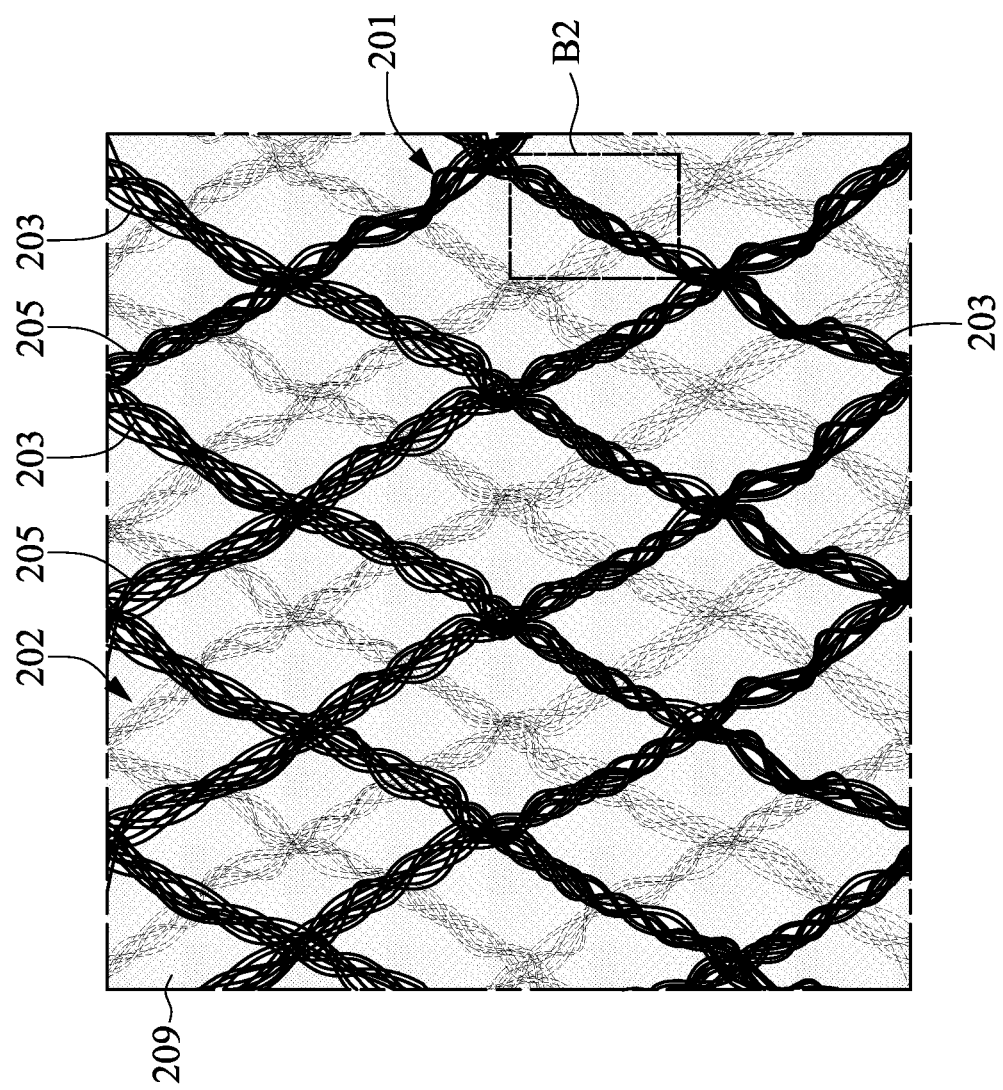
FIG. 2C is an enlarged view of portion "B1" illustrated in FIG. 2A.

FIG. 2C is an enlarged view of portion "B1" illustrated in FIG. 2A. In some embodiments of the present disclosure, the mesh structure 20 includes multiple knitted layers 201 and 202. The knitted layer 201 may be adjacent to the knitted layer 202. In some embodiments of the present disclosure, the knitted layer 201 may include a plurality of elongated multilayer structure 203 and a plurality of elongated multilayer structure 205. In some embodiments of the present disclosure, the multilayer structure 203 is a ply yarn. In some embodiments of the present disclosure, the multilayer structure 203 is a conductive yarn. Further, the elongated multilayer structures 203 are spaced apart from each other and extend parallel to each other, substantially in one direction. In some embodiments of the present disclosure, the multilayer structure 205 is a ply yarn. In some embodiments of the present disclosure, the multilayer structure 205 is a conductive yarn. The elongated multilayer structures 205 are spaced apart from each other and extend parallel to each other, substantially in another direction, which is different from the direction which the elongated multilayer structures 203 extend along. That is, the elongated multilayer structures 203 and the elongated multilayer structures 205 may be interwoven with each other or combined with each other to form the knitted layer 201. Therefore, the knitted layer 201 may be flexible. In some embodiments of the present disclosure, the knitted layer 202 is similar to or the same as the knitted layer 201.

In some embodiments of the present disclosure, the mesh structure 20 includes a non-conductive layer 209. In some embodiments of the present disclosure, the non-conductive layer 209 is arranged between the knitted layer 201 and the knitted layer 202. The non-conductive layer 209 may include a non-conductive material. The non-conductive layer 209 may be flexible. Since the mesh structure 20 may include the flexible knitted layer 201, the flexible knitted layer 202 and the flexible non-conductive layer 209, the mesh structure 20 of the shielding apparatus 2 may be flexible.

Figure 2D:
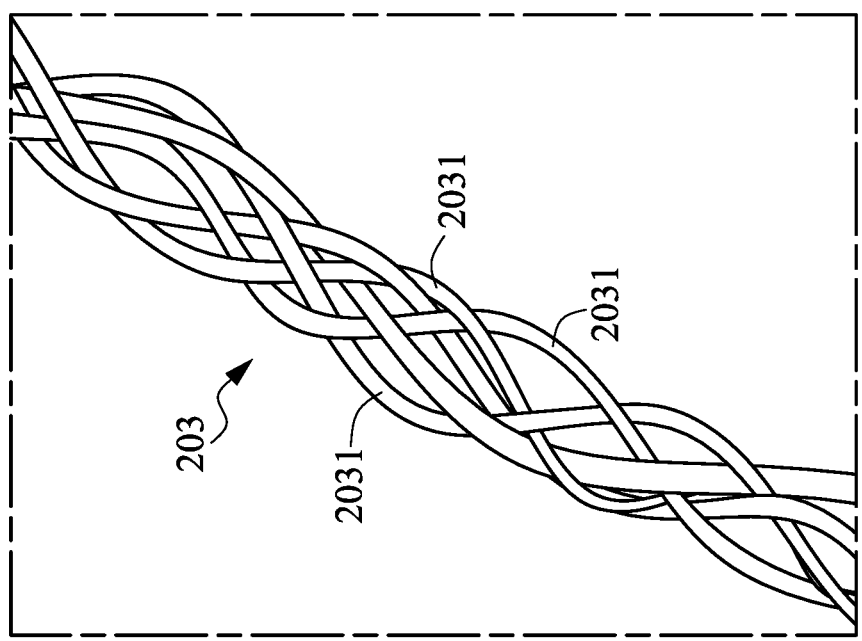
FIG. 2D is an enlarged view of portion "B2" illustrated in FIG. 2C.

FIG. 2D is an enlarged view of portion "B2" illustrated in FIG. 2C. Especially it illustrates an embodiment of the elongated multilayer structure 203 as shown in FIG. 2C.

Referring to FIG. 2D, the elongated multilayer structure 203 may include a plurality of conductive layers 2031 which are combined with each other. In some embodiments of the present disclosure, a number of the conductive layers 2031 in each elongated multilayer structure 203 is at least 20. In some embodiments of the present disclosure, the multilayer structure 203 is a ply yarn, and the conductive layers 2031 is a metal filament. In some embodiments of the present disclosure, the multiplayer structure 203 is a conductive yarn, and conductive layers 2031 is a conductive filament. The conductive layer 2031 may include at least one metal material, wherein the metal material may include aluminum and/or nickel. Further, each of the conductive layer 2031 may have its own outer surface. Since the elongated multilayer structure 203 may include a plurality of the conductive layers 2031 and each of the conductive layer 2031 may have its own outer surface, the conductive surface of the elongated multilayer structure 203 is increased. Therefore, the elongated multilayer structure 203 may have a significantly large surface area of conductive surface. In some embodiments of the present disclosure, the structure of the elongated multilayer structure 205 is the same as or similar to the structure of the elongated multilayer structure 203. That is, the elongated multilayer structure 205 may have a significantly large surface area of conductive surface as well. Moreover, since the knitted layer 201 of the mesh structure 20 may be formed by interweaving the elongated multilayer structures 203 and the elongated multilayer structures 205 with each other and the knitted layer 202 may be also formed in a similar or identical manner, the mesh structure 20 may have a significantly large surface area of conductive surface accordingly. Therefore, the electromagnetic shielding effectiveness of the shielding apparatus 2 may be significantly increased.

Figure 2E:
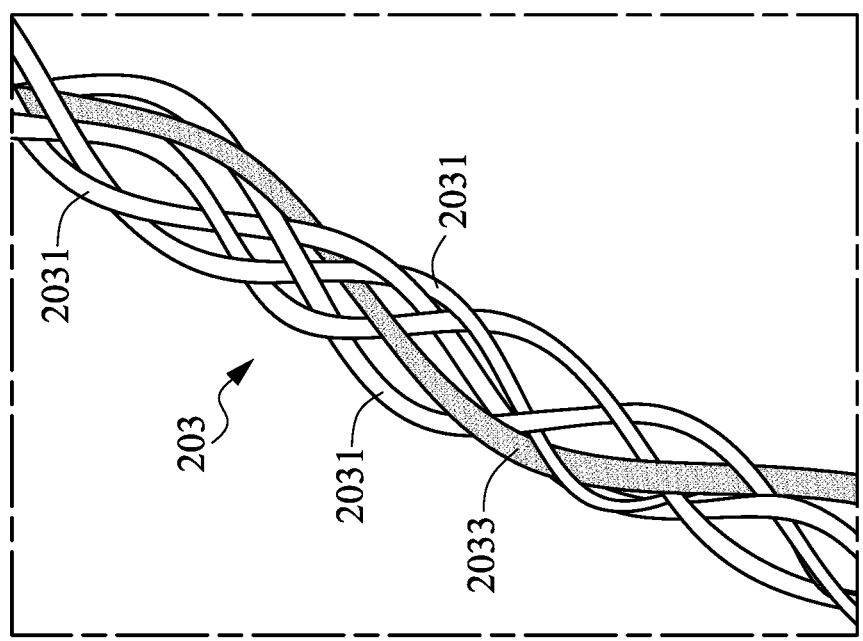
FIG. 2E is an enlarged view of portion "B2" illustrated in FIG. 2C.

FIG. 2E is an enlarged view of portion "B2" illustrated in FIG. 2C. Especially it illustrates another embodiment of the elongated multilayer structure 203 as shown in FIG. 2C.

Referring to FIG. 2E, the elongated multilayer structure 203 may include a plurality of conductive layers 2031 which are combined with each other. In some embodiments of the present disclosure, a number of the conductive layers 2031 in each elongated multilayer structure 203 is at least 20. In some embodiments of the present disclosure, the multilayer structure 203 is a ply yarn, and the conductive layers 2031 is a metal filament. In some embodiments of the present disclosure, the multiplayer structure 203 is a conductive yarn, and the conductive layers 2031 is a conductive filament. The conductive layer 2031 may include at least one metal material, wherein the metal material may include aluminum and/or nickel. Moreover, the elongated structure 203 may further include at least one non-conductive layer 2033. In some embodiments of the present disclosure, the non-conductive layer 2033 is a non-conductive filament. The at least one non-conductive layer 2033 may be combined with the conductive layers 2031 and thus the at least one non-conductive layer may be a part of the multilayer structure 203. Further, each of the conductive layer 2031 may have its own outer surface. Since the elongated multilayer structure 203 may include a plurality of the conductive layers 2031 and each of the conductive layer 2031 may have its own outer surface, and thus the conductive surface of the elongated multilayer structure 203 is increased. Therefore, the elongated multilayer structure 203 may have a significantly large surface area of conductive surface. In some embodiments of the present disclosure, the structure of the elongated multilayer structure 205 is the same as or similar to the structure of the elongated multilayer structure 203. That is, the elongated multilayer structure 205 may have a significantly large surface area of conductive surface as well. Moreover, since the knitted layer 201 of the mesh structure 20 may be formed by interweaving the elongated multilayer structures 203 and the elongated multilayer structures 205 with each other and the knitted layer 202 may be also formed in a similar or identical manner, the mesh structure 20 may have a significantly large surface area of conductive surface accordingly. Therefore, the electromagnetic shielding effectiveness of the shielding apparatus 2 may be significantly increased.

Figure 3A:
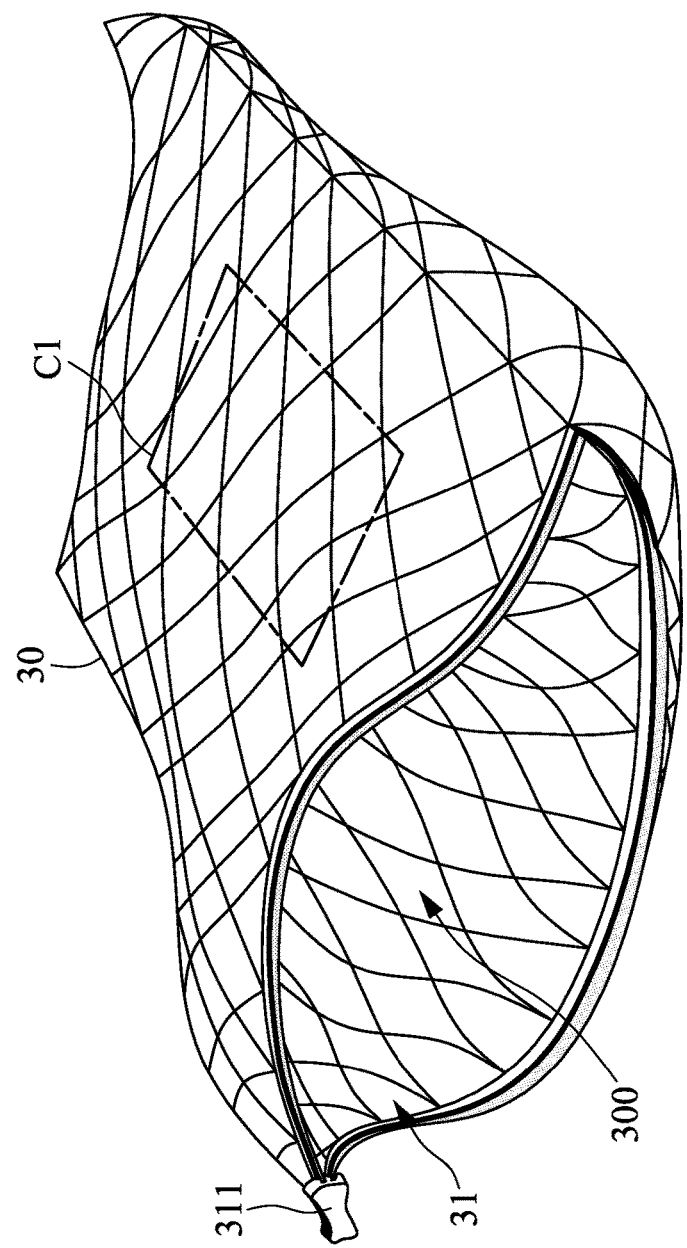
FIG. 3A is a schematic perspective view of the shielding apparatus 3, in accordance with some embodiments of the present disclosure.

FIG. 3A is a schematic perspective view of the shielding apparatus 3, in accordance with some embodiments of the present disclosure. The shielding apparatus 3 may include a mesh structure 30 and an opening 31. As shown in FIG. 3A, the overall shape of the shielding apparatus 3 is substantially bag-like in appearance. In some embodiments of the present disclosure, the mesh structure 30 includes at least one conductive material. Referring to FIG. 3A, the mesh structure 30 of the shielding apparatus 3 define an inner space 300 which is configured to accommodate an electronic component that needs to be shielded. Moreover, the electronic component may enter the inner space 300 defined by the mesh structure 30 through the opening 31. The opening 31 may include a zipper assembly 311 and thus the opening 31 is opened and closed by the zipper assembly 311. When the zipper assembly 311 is pulled open, the opening 31 may be opened. That is, the electronic component that needs to be shielded may be put into the inner space 300 defined by the mesh structure 30 through the opening 31. When the zipper assembly 311 is pulled close, the opening 31 may be closed and the inner space becomes mostly closed off. That is, the electronic component that needs to be shield may be enclosed in the inner space 300 or surrounded by the mesh structure 30 when the electronic component enters into the inner space 300 and the opening 31 is closed. Moreover, as the zipper assembly 311 is pulled close, the zipper assembly may be partially closed to maintain a channel when the opening 31 is closed. Thus, when the electronic component that needs to be shield is received in the inner space 300 and the opening 31 are closed, a portion of the electronic component, such as electrical connection wire or power cable, may pass through the passage of the opening 31 and connect the device outside the shielding apparatus 3.

Given the above, the mesh structure 30 is configured to receive and enclose the electronic component that needs to be shield in the inner space 300 defined by the mesh structure 30. Since the mesh structure 30 may include the conductive material, thus the mesh structure 30 may shield external electromagnetic waves, allowing the electronic components inside the enclosed inner space 300 of the mesh structure 30 to be unaffected by electromagnetic interference caused by external electromagnetic waves. Further, because the opening 31 of the mesh structure 30 may retain the passage when the opening 31 is in the closed state, the electrical connection cable of the electronic component may pass through this passage to connect with external devices outside the shielding apparatus. Therefore, during the use of the shielding apparatus 3, the electronic component can continue to operate.

Moreover, the mesh structure 30 of the shielding layer 1 may be flexible and/or deformable. Thus, mesh structure 30 may deform to properly enclose or surround the electronic component that need to be shield and to accommodate the electronic component in the inner space 300 of the mesh structure 30.

Figure 3B:
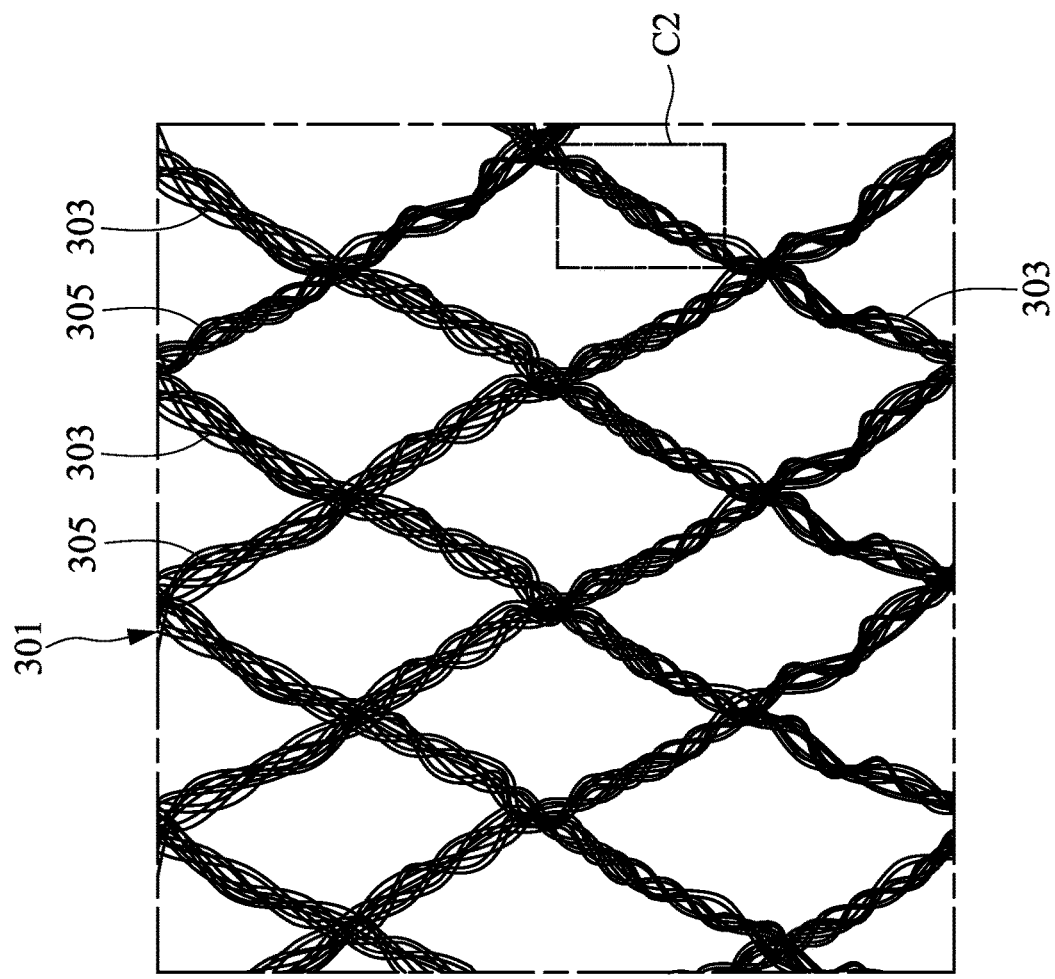
FIG. 3B is an enlarged view of portion "C1" illustrated in FIG. 3A.

FIG. 3B is an enlarged view of portion "C1" illustrated in FIG. 3A. In some embodiments of the present disclosure, the mesh structure 30 include a single knitted layer 301. In some embodiments of the present disclosure, the knitted layer 301 may include a plurality of elongated multilayer structure 303 and a plurality of elongated multilayer structure 305. In some embodiments of the present disclosure, the multilayer structure 303 is a ply yarn. In some embodiments of the present disclosure, the multilayer structure 303 is a conductive yarn. Further, the elongated multilayer structures 303 are spaced apart from each other and extend parallel to each other, substantially in one direction. In some embodiments of the present disclosure, the multilayer structure 305 is a ply yarn. In some embodiments of the present disclosure, the multilayer structure 305 is a conductive yarn. The elongated multilayer structures 305 are spaced apart from each other and extend parallel to each other, substantially in another direction, which is different from the direction which the elongated multilayer structures 303 extend along. That is, the elongated multilayer structures 303 and the elongated multilayer structures 305 may be interwoven with each other or combined with each other to form the knitted layer 301. Since the knitted layer 301 of the mesh structure 30 may be formed by interweaving the elongated multilayer structures 303 and the elongated multilayer structures 105 with each other, the mesh structure 30 may be flexible.

Figure 3C:
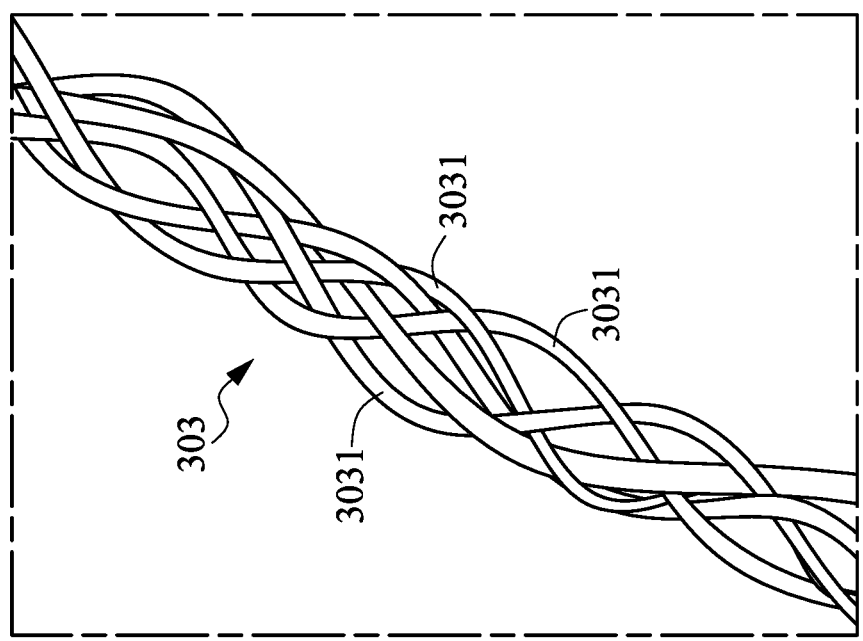
FIG. 3C is an enlarged view of portion "C2" illustrated in FIG. 3C.

FIG. 3C is an enlarged view of portion "C2" illustrated in FIG. 3B. Especially it illustrates an embodiment of the elongated multilayer structure 303 as shown in FIG. 3B.

Referring to FIG. 3C, the elongated multilayer structure 303 may include a plurality of conductive layers 3031 which are combined with each other. In some embodiments of the present disclosure, a number of the conductive layers 3031 in each elongated multilayer structure 303 is at least 20. In some embodiments of the present disclosure, the multilayer structure 303 is a ply yarn, and the conductive layers 3031 is a metal filament. In some embodiments of the present disclosure, the multiplayer structure 303 is a conductive yarn, and the conductive layer 3031 is a conductive filament. The conductive layer 3031 may include at least one metal material, wherein the metal material may include aluminum and/or nickel. Further, each of the conductive layer 3031 may have its own outer surface. Since the elongated multilayer structure 303 may include a plurality of the conductive layers 3031 and each of the conductive layer 3031 may have its own outer surface, the conductive surface of the elongated multilayer structure 303 is increased. Therefore, the elongated multilayer structure 303 may have a significantly large surface area of conductive surface. In some embodiments of the present disclosure, the structure of the elongated multilayer structure 305 is the same as or similar to the structure of the elongated multilayer structure 303. That is, the elongated multilayer structure 305 may have a significantly large surface area of conductive surface as well. Moreover, since the knitted layer 301 of the mesh structure 30 may be formed by interweaving the elongated multilayer structures 303 and the elongated multilayer structures 305 with each other, the mesh structure 30 may have a significantly large surface area of conductive surface accordingly. Therefore, the electromagnetic shielding effectiveness of the shielding apparatus 3 may be significantly increased.

Figure 3D:
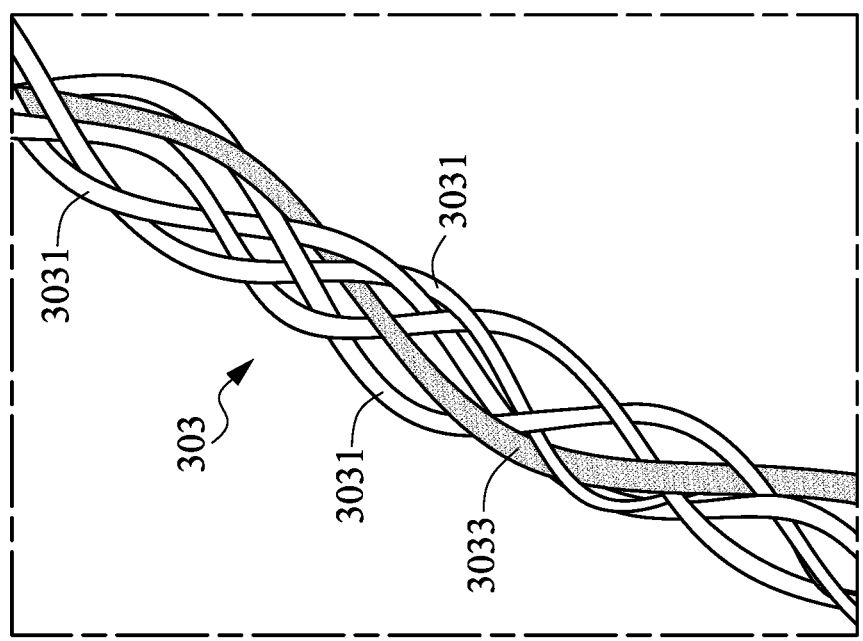
FIG. 3D is an enlarged view of portion "C2" illustrated in FIG. 3B.

FIG. 3D is an enlarged view of portion "c2" illustrated in FIG. 3B. Especially it illustrates another embodiment of the elongated multilayer structure 303 as shown in FIG. 3C.

Referring to FIG. 3D, the elongated multilayer structure 303 may include a plurality of conductive layers 3031 which are combined with each other. In some embodiments of the present disclosure, a number of the conductive layers 3031 in each elongated multilayer structure 303 is at least 20. In some embodiments of the present disclosure, the multilayer structure 303 is a ply yarn, and the conductive layers 3031 is a metal filament. In some embodiments of the present disclosure, the multiplayer structure 303 is a conductive yarn, and the conductive layers 3031 is a conductive filament. The conductive layer 3031 may include at least one metal material, wherein the metal material may include aluminum and/or nickel. Moreover, the elongated structure 303 may further include at least one non-conductive layer 3033. In some embodiments of the present disclosure, the non-conductive layer 3033 is a non-conductive filament. The at least one non-conductive layer 3033 may be combined with the conductive layers 3031 and thus the at least one non-conductive layer may be a part of the multilayer structure 303. Further, each of the conductive layer 3031 may have its own outer surface. Since the elongated multilayer structure 303 may include a plurality of the conductive layers 3031 and each of the conductive layer 3031 may have its own outer surface, the conductive surface of the elongated multilayer structure 303 is increased. Therefore, the elongated multilayer structure 303 may have a significantly large surface area of conductive surface. In some embodiments of the present disclosure, the structure of the elongated multilayer structure 305 is the same as or similar to the structure of the elongated multilayer structure 303. That is, the elongated multilayer structure 305 may have a significantly large surface area of conductive surface as well. Moreover, since the knitted layer 301 of the mesh structure 30 may be formed by interweaving the elongated multilayer structures 103 and the elongated multilayer structures 305 with each other, the mesh structure 30 may have a significantly large surface area of conductive surface accordingly. Therefore, the electromagnetic shielding effectiveness of the shielding apparatus 3 may be significantly increased.

Figure 4A:
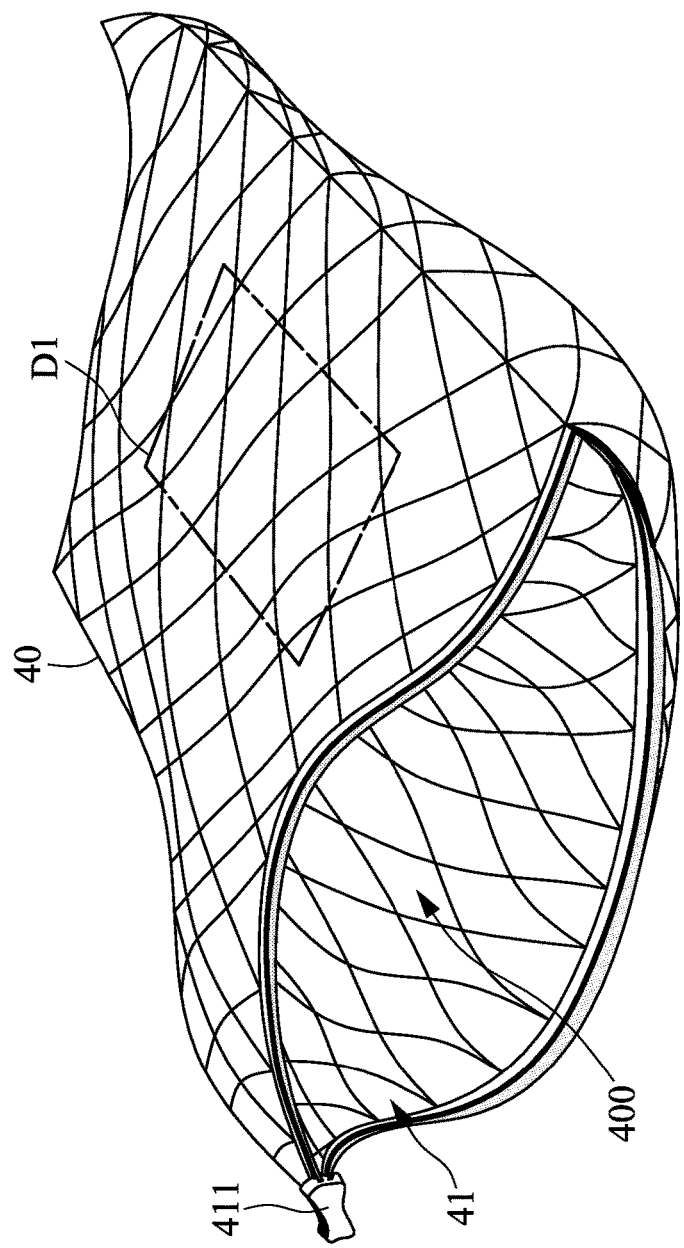
FIG. 4A is a schematic perspective view of the shielding apparatus 3, in accordance with some embodiments of the present disclosure.

FIG. 4A is a schematic perspective view of the shielding apparatus 4, in accordance with some embodiments of the present disclosure. The shielding apparatus 4 may include a mesh structure 40 and an opening 41. As shown in FIG. 4A, the overall shape of the shielding apparatus 4 is substantially bag-like in appearance. In some embodiments of the present disclosure, the mesh structure 30 includes at least one conductive material. Referring to FIG. 4A, the mesh structure 40 of the shielding apparatus 4 define an inner space 400 which is configured to accommodate an electronic component that needs to be shielded. Moreover, the electronic component may enter the inner space 400 defined by the mesh structure 40 through the opening 41. The opening 41 may include a zipper assembly 411 and thus the opening 41 is opened and closed by the zipper assembly 411. When the zipper assembly 411 is pulled open, the opening 41 may be opened. That is, the electronic component that needs to be shielded may be put into the inner space 400 defined by the mesh structure 40 through the opening 41. When the zipper assembly 411 is pulled close, the opening 41 may be closed and the inner space becomes mostly closed off. That is, the electronic component that needs to be shield may be enclosed in the inner space 400 or surrounded by the mesh structure 40 when the electronic component enters into the inner space 400 and the opening 41 is closed. Moreover, as the zipper assembly 411 is pulled close, the zipper assembly 411 may be partially closed to maintain a channel when the opening 41 is closed. Thus, when the electronic component that needs to be shield is received in the inner space 400 and the opening 41 are closed, a portion of the electronic component, such as electrical connection wire or power cable, may pass through the passage of the opening 41 and connect the device outside the shielding apparatus 4.

Given the above, the mesh structure 40 is configured to receive and enclose the electronic component that needs to be shield in the inner space 400 defined by the mesh structure 40. Since the mesh structure 40 may include the conductive material, thus the mesh structure 40 may shield external electromagnetic waves, allowing the electronic components inside the enclosed inner space 400 of the mesh structure 40 to be unaffected by electromagnetic interference caused by external electromagnetic waves. Further, because the opening 31 of the mesh structure 40 may retain the passage when the opening 41 is in the closed state, the electrical connection cable of the electronic component may pass through this passage to connect with external devices outside the shielding apparatus. Therefore, during the use of the shielding apparatus 4, the electronic component can continue to operate.

Moreover, the mesh structure 40 of the shielding layer 4 may be flexible and/or deformable. Thus, mesh structure 40 may deform to properly enclose or surround the electronic component that need to be shield and to accommodate the electronic component in the inner space 300 of the mesh structure 40.

Figure 4B:
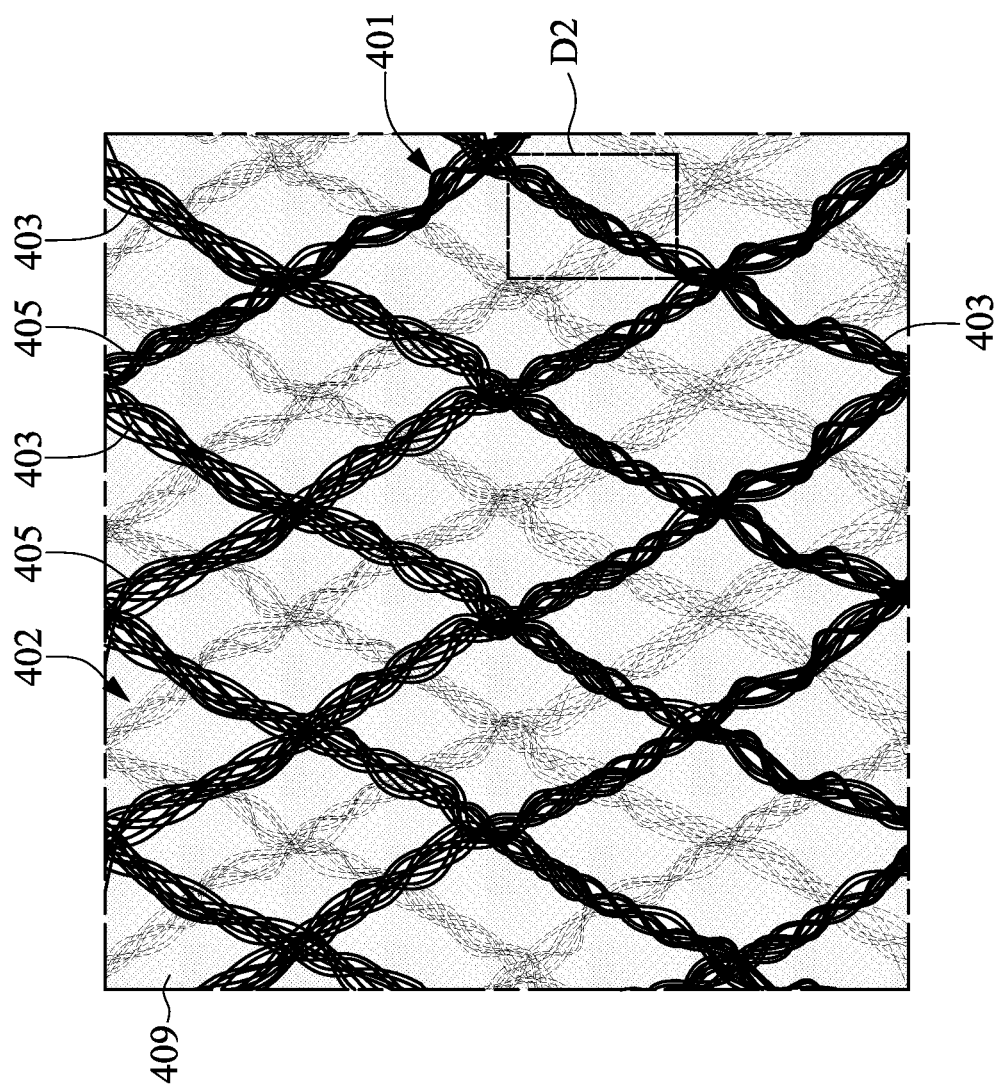
FIG. 4B is an enlarged view of portion "D1" illustrated in FIG. 4A.

FIG. 4B is an enlarged view of portion "D1" illustrated in FIG. 4A. In some embodiments of the present disclosure, the mesh structure 40 includes multiple knitted layers 401 and 402. The knitted layer 401 may be adjacent to the knitted layer 402. In some embodiments of the present disclosure, the knitted layer 401 may include a plurality of elongated multilayer structure 403 and a plurality of elongated multilayer structure 405. In some embodiments of the present disclosure, the multilayer structure 403 is a ply yarn. In some embodiments of the present disclosure, the multilayer structure 403 is a conductive yarn. Further, the elongated multilayer structures 403 are spaced apart from each other and extend parallel to each other, substantially in one direction. In some embodiments of the present disclosure, the multilayer structure 405 is a ply yarn. In some embodiments of the present disclosure, the multilayer structure 405 is a conductive yarn. The elongated multilayer structures 405 are spaced apart from each other and extend parallel to each other, substantially in another direction, which is different from the direction which the elongated multilayer structures 403 extend along. That is, the elongated multilayer structures 403 and the elongated multilayer structures 405 may be interwoven with each other or combined with each other to form the knitted layer 401. Therefore, the knitted layer 401 may be flexible. In some embodiments of the present disclosure, the knitted layer 402 is similar to or the same as the knitted layer 401.

In some embodiments of the present disclosure, the mesh structure 40 includes a non-conductive layer 409. In some embodiments of the present disclosure, the non-conductive layer 409 is arranged between the knitted layer 401 and the knitted layer 402. The non-conductive layer 209 may include a non-conductive material. The non-conductive layer 409 may be flexible. Since the mesh structure 40 may include the flexible knitted layer 401, the flexible knitted layer 402 and the flexible non-conductive layer 409, the mesh structure 40 of the shielding apparatus 4 may be flexible.

Figure 4C:
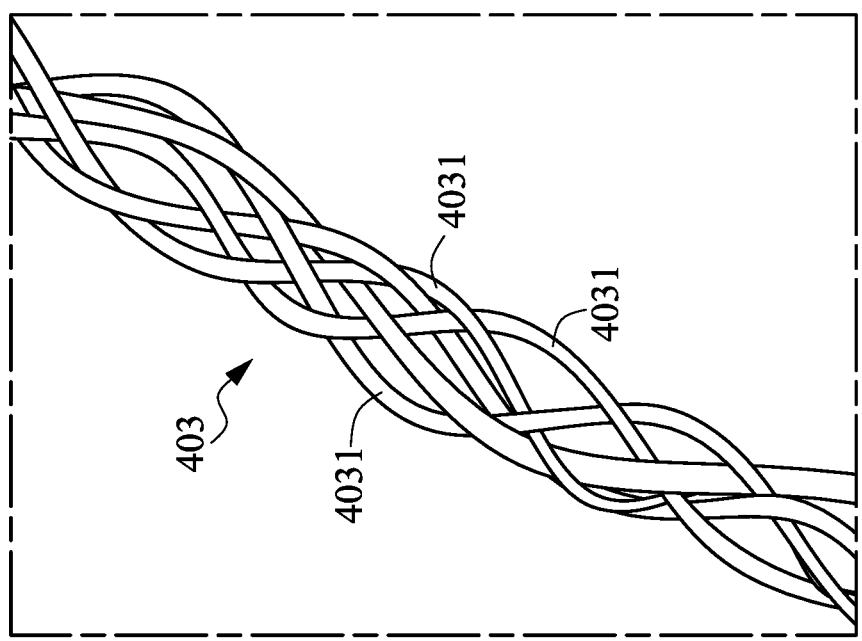
FIG. 4C is an enlarged view of portion "D2" illustrated in FIG. 4B.

FIG. 4C is an enlarged view of portion "D2" illustrated in FIG. 4B. Especially it illustrates an embodiment of the elongated multilayer structure 403 as shown in FIG. 4B.

Referring to FIG. 4C, the elongated multilayer structure 403 may include a plurality of conductive layers 4031 which are combined with each other. In some embodiments of the present disclosure, a number of the conductive layers 4031 in each elongated multilayer structure 403 is at least 20. In some embodiments of the present disclosure, the multilayer structure 403 is a ply yarn, and the conductive layers 4031 is a metal filament. In some embodiments of the present disclosure, the multiplayer structure 403 is a conductive yarn, and conductive layers 4031 is a conductive filament. The conductive layer 4031 may include at least one metal material, wherein the metal material may include aluminum and/or nickel. Further, each of the conductive layer 4031 may have its own outer surface. Since the elongated multilayer structure 403 may include a plurality of the conductive layers 4031 and each of the conductive layer 4031 may have its own outer surface, the conductive surface of the elongated multilayer structure 403 is increased. Therefore, the elongated multilayer structure 403 may have a significantly large surface area of conductive surface. In some embodiments of the present disclosure, the structure of the elongated multilayer structure 405 is the same as or similar to the structure of the elongated multilayer structure 403. That is, the elongated multilayer structure 405 may have a significantly large surface area of conductive surface as well. Moreover, since the knitted layer 401 of the mesh structure 40 may be formed by interweaving the elongated multilayer structures 403 and the elongated multilayer structures 405 with each other and the knitted layer 402 may be also formed in a similar or identical manner, the mesh structure 40 may have a significantly large surface area of conductive surface accordingly. Therefore, the electromagnetic shielding effectiveness of the shielding apparatus 4 may be significantly increased.

Figure 4D:
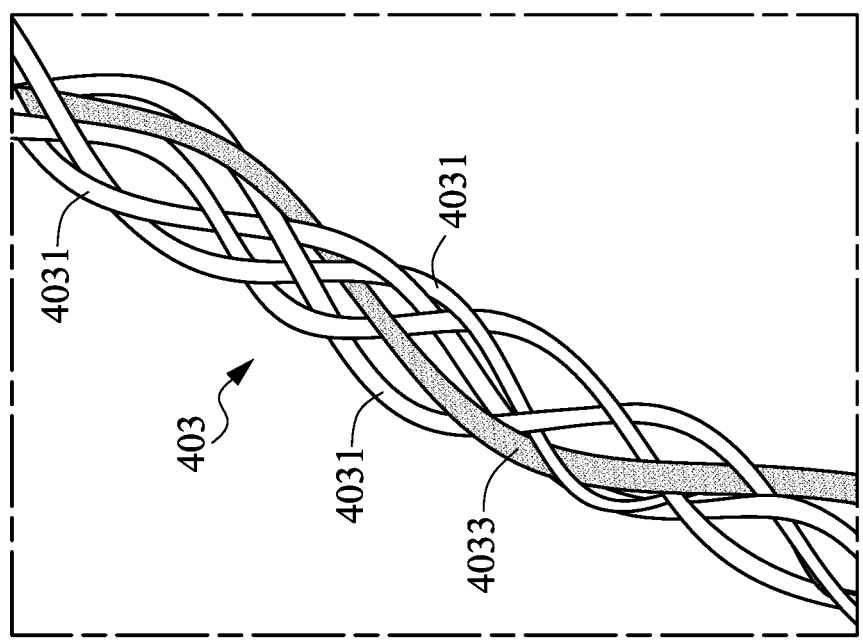
FIG. 4D is an enlarged view of portion "D2" illustrated in FIG. 4B.

FIG. 4D is an enlarged view of portion "D2" illustrated in FIG. 4B. Especially it illustrates another embodiment of the elongated multilayer structure 403 as shown in FIG. 4B.

Referring to FIG. 4D, the elongated multilayer structure 403 may include a plurality of conductive layers 4031 which are combined with each other. In some embodiments of the present disclosure, a number of the conductive layers 4031 in each elongated multilayer structure 403 is at least 20. In some embodiments of the present disclosure, the multilayer structure 403 is a ply yarn, and the conductive layers 4031 is a metal filament. In some embodiments of the present disclosure, the multiplayer structure 403 is a conductive yarn, and the conductive layers 4031 is a conductive filament. The conductive layer 4031 may include at least one metal material, wherein the metal material may include aluminum and/or nickel. Moreover, the elongated structure 403 may further include at least one non-conductive layer 4033. In some embodiments of the present disclosure, the non-conductive layer 4033 is a non-conductive filament. The at least one non-conductive layer 4033 may be combined with the conductive layers 4031 and thus the at least one non-conductive layer may be a part of the multilayer structure 403. Further, each of the conductive layer 4031 may have its own outer surface. Since the elongated multilayer structure 403 may include a plurality of the conductive layers 4031 and each of the conductive layer 4031 may have its own outer surface, and thus the conductive surface of the elongated multilayer structure 403 is increased. Therefore, the elongated multilayer structure 403 may have a significantly large surface area of conductive surface. In some embodiments of the present disclosure, the structure of the elongated multilayer structure 405 is the same as or similar to the structure of the elongated multilayer structure 403. That is, the elongated multilayer structure 405 may have a significantly large surface area of conductive surface as well. Moreover, since the knitted layer 401 of the mesh structure 40 may be formed by interweaving the elongated multilayer structures 403 and the elongated multilayer structures 405 with each other and the knitted layer 402 may be also formed in a similar or identical manner, the mesh structure 40 may have a significantly large surface area of conductive surface accordingly. Therefore, the electromagnetic shielding effectiveness of the shielding apparatus 4 may be significantly increased.

Figure 5:
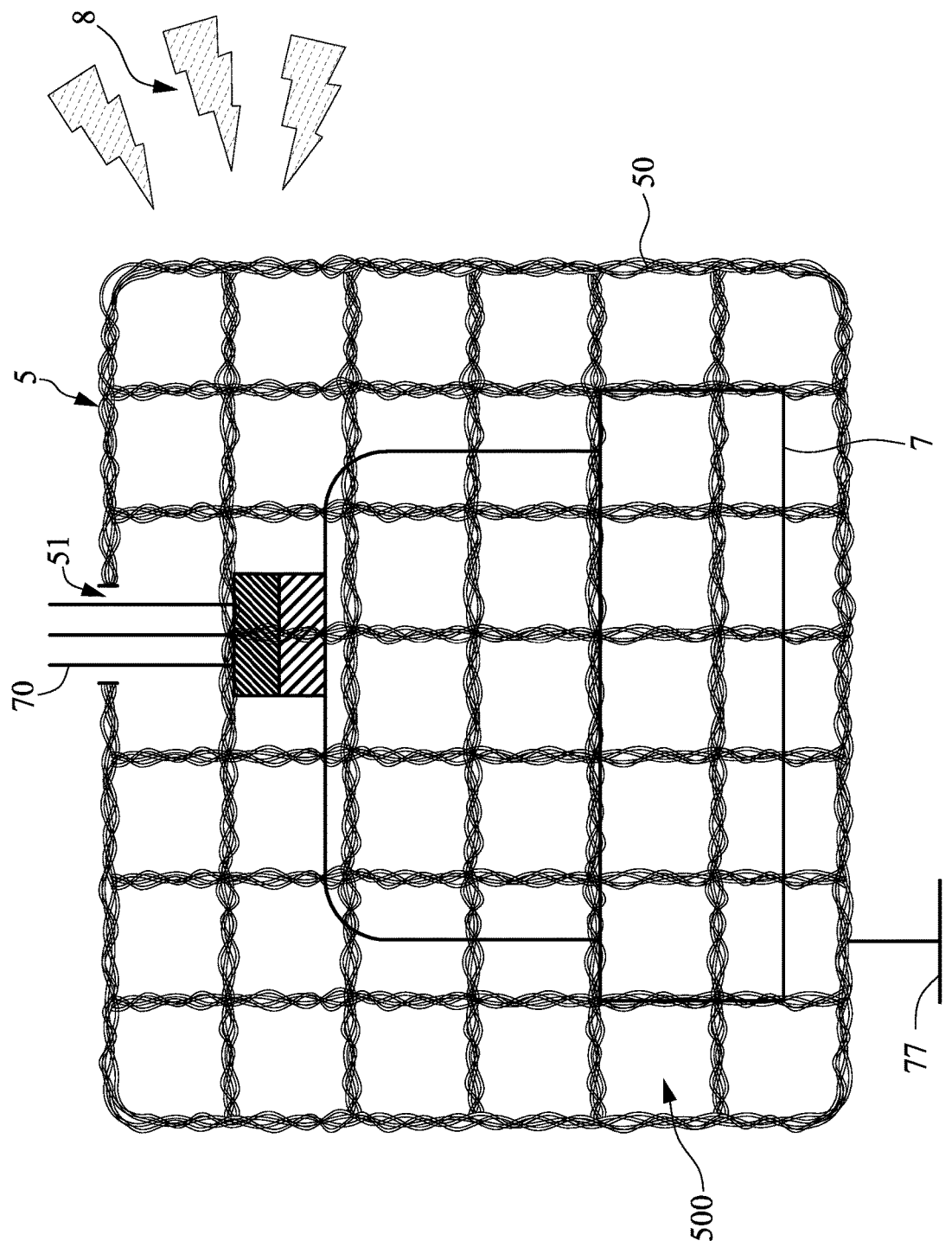
FIG. 5 illustrates a state of use of the shielding apparatus, in accordance with some embodiments of the present disclosure.

FIG. 5 illustrates a state of use of the shielding apparatus 5, in accordance with some embodiments of the present disclosure. The shielding apparatus 5 shown in FIG. 5 may be similar to or the same as the shielding apparatus 1, 2, 3 or 4. As shown in FIG. 5, an electronic component 7 is enclosed in the inner space 500 of the mesh structure 50 of the shielding structure 5. As above mentioned, the mesh structure 50 of the shielding structure 5 may be flexible, and thus the mesh structure 50 may deform according to the shape of electronic component 7, so as to properly encapsulate the electronic component 7. Further, referring to FIG. 5, the opening 51 of the mesh structure 50 of the shielding apparatus 5 may maintain a channel when closed, so the electrical connection wire 70 of the electronic component 7 enclosed in the mesh structure 50 of the shielding apparatus may pass through the channel of the opening 51 and connect with an external device.

Due to the shielding apparatus 5 of the present disclosure having more conductive surfaces, it can effectively block external electromagnetic fields 8 from entering the inner space 500 of the shielding apparatus and affecting the electronic component 7 placed inside. In addition, the shielding apparatus 5 may be connected to a potential 77, such as ground. Connecting the shielding apparatus 5 to the potential 77 is to establish a potential difference with other conductors or the ground. This ensures that the potential between the shielding apparatus 5 and other conductors is equal, thereby preventing abnormal distribution of electric fields. This is essential for maintaining electrical neutrality within the shielding apparatus 5 and ensuring effective shielding.

Figure 6:
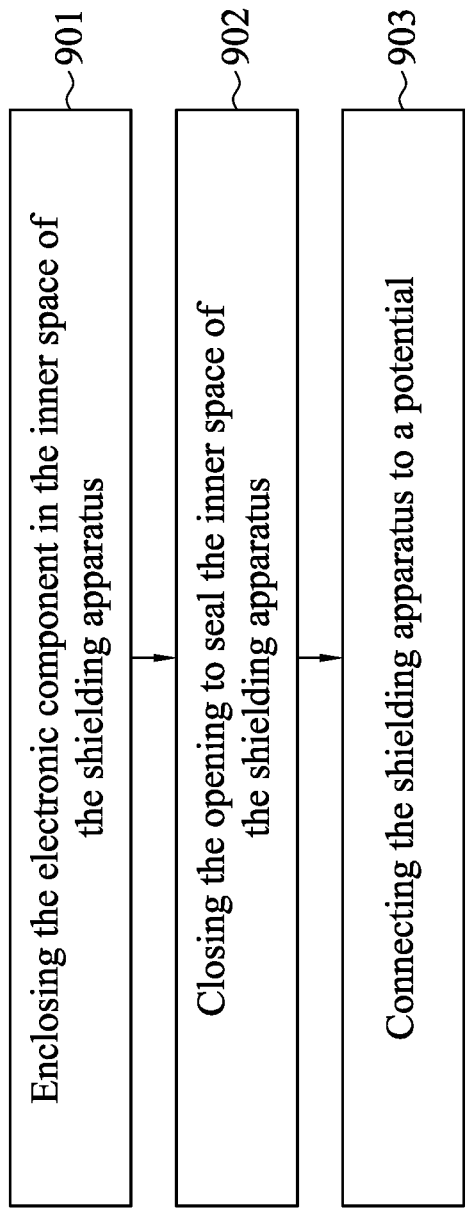
FIG. 6 is a flow chart representing exemplary operations of the method for operating the shielding apparatus, in accordance with some embodiments of the present disclosure.

FIG. 6 is a flow chart representing exemplary operations of the method for operating the shielding apparatus, in accordance with some embodiments of the present disclosure.

In step 901, an electronic component that needs to be shielded may be surrounded by a mesh structure of a shielding apparatus. Since the mesh structure of the shielding apparatus may be flexible, the mesh structure may deform according to the shape of electronic component, so as to properly surround the electronic component.

In step 902, the opening of the mesh structure of the shielding layer may be closed so that the inner space of the mesh structure that encloses the electronic component may be substantially closed. Moreover, the opening may retain a passage when it is closed, so that a portion of the electronic component may pass through the passage of the opening and connect an external device. Therefore, when the electronic component is connected to an external device via an electrical connection wire and is in operation, the shielding apparatus may encapsulate the electronic component without the need to disassemble it from the external device, thus maintaining the operation of the electronic component.

In step 903, the shielding apparatus may be connected to a potential, such ground.

It will be appreciated that in the forgoing apparatus, the effectiveness of electromagnetic shielding achieved will increase. The shielding apparatus may include a plurality of conductive yarns, and each of the conductive yarns may have a plurality of conductive filaments. Moreover, each of the conductive yarn may have its own outer surface. Therefore, the shielding apparatus may have a significantly large surface area of conductive surface, and such a large conductive surface may increase the efficiency of electromagnetic shielding. In addition, the shielding apparatus may include a flexible mesh structure and thus the shielding may deform to enclose the electronic components of different shapes.

According to one embodiment of the present disclosure, a shielding apparatus, comprises a plurality of first ply yarns and a plurality of second ply yarns. Each of the first ply yarns comprises a plurality of metal filaments, and each of the second ply yarns comprises a plurality of metal filaments. The first ply yarns and the second ply yarns are interwoven with each other to form a first knitted layer, and the first knitted layer is configured to deform to accommodate an object received therein.

According to another embodiment of the present disclosure, a shielding apparatus, comprises: a plurality of first elongated conductive multilayer structures and a plurality of second elongated conductive multilayer structures. Each of the first elongated conductive multilayer structures extends along a first direction, and each of the second elongated conductive multilayer structures extends along a second direction which is different from the first direction. The first elongated conductive multilayer structures are combined with the second elongated conductive multilayer structures to form a flexible mesh structure, and the mesh structure is configured to encapsulate an electronic device.

According to another embodiment of the present disclosure, a shielding mesh structure, comprises a plurality of conductive yarns. The conductive yarns are interwoven to form the shielding mesh structure. Each of the conductive yarns comprises a plurality of conductive filaments, and wherein each of the conductive filament has its own outer surface. The shielding mesh structure is configured to provide electromagnetic shielding for an object enclosed by the shielding mesh structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A shielding apparatus, comprising:
a plurality of first ply yarns, wherein each of the first ply yarns comprises a plurality of metal filaments, and wherein each of the metal filaments has its own outer surface, and wherein a number of the metal filaments in each of the first ply yarns is at least 20; and
a plurality of second ply yarns, wherein each of the second ply yarns comprises a plurality of metal filaments, and wherein each of the metal filaments has its own outer surface, and wherein a number of the metal filaments in each of the second ply yarns is at least 20;
wherein the first ply yarns and the second ply yarns are interwoven with each other to form a first layer;
wherein the first layer is configured to deform to accommodate an object and provide electromagnetic shielding for the object.

2. The shielding apparatus of claim 1, wherein the first layer comprises an opening which is configured to allow a component connected to the object to pass through it.

3. The shielding apparatus of claim 2, wherein a size of the opening is configured to be changed.

4. The shielding apparatus of claim 2, wherein the opening comprises a stretch mechanism.

5. The shielding apparatus of claim 2, wherein the opening comprises a zipper assembly.

6. The shielding apparatus of claim 1, further comprising:
a plurality of third ply yarns, wherein each of the third ply yarns comprises a plurality of metal filaments, and wherein each of the metal filaments has its own outer surface, and wherein a number of the metal filaments in each of the third ply yarns is at least 20; and
a plurality of fourth ply yarns, wherein each of the fourth ply yarns comprises a plurality of metal filaments, and wherein each of the metal filaments has its own outer surface, and wherein a number of the metal filaments in each of the fourth ply yarns is at least 20;
wherein the third ply yarns and the fourth ply yarns are interwoven with each other to form a second layer;
wherein the second layer is adjacent to the first layer.

7. The shielding apparatus of claim 6, further comprising a non-conductive structure between the first layer and the second layer.

8. The shielding apparatus of claim 1, wherein each of the first ply yarns comprises at least one non-conductive filament, and wherein each of the second ply yarns comprises at least one non-conductive filament.

9. The shielding apparatus of claim 1, wherein the first layer has a substantially bag-like appearance and defines an inner space configured to enclose the object.

10. The shielding apparatus of claim 9, further comprising an opening, wherein, when the object is enclosed in the inner space of the first layer, an electrical connection wire of the object passes through the opening and connects with an external device.

11. The shielding apparatus of claim 1, wherein the first layer is connected to a potential.

12. A shielding apparatus, comprising:
a plurality of first elongated conductive multilayer structures, wherein each of the first elongated conductive multilayer structures extends along a first direction; and
a plurality of second elongated conductive multilayer structures, wherein each of the second elongated conductive multilayer structures extends along a second direction which is different from the first direction;
wherein the first elongated conductive multilayer structures are combined with the second elongated conductive multilayer structures to form a flexible mesh structure;
wherein each of the first elongated conductive multilayer structures comprises a plurality of first conductive filaments and wherein each of the first conductive filaments has its own outer surface, and wherein a number of the first conductive filaments in each of the first elongated conductive multilayer structures is at least 20;
wherein each of the second elongated conductive multilayer structures comprises a plurality of second conductive filaments and wherein each of the second conductive filaments has its own outer surface, and wherein a number of the second conductive filaments in each of the second elongated conductive multilayer structures is at least 20;
wherein the mesh structure is configured to encapsulate an electronic device and provide electromagnetic shielding for the electronic device.

13. The shielding apparatus of claim 12, wherein the flexible mesh structure comprises an opening that can be opened and closed.

14. The shielding apparatus of claim 13, wherein the flexible mesh structure is configured to define a space for receiving the electronic device when the opening is closed.

15. The shielding apparatus of claim 12, wherein the first conductive filaments in each of the first elongated conductive multilayer structures are twisted with each other, and wherein the second conductive filaments in in each of the second elongated conductive multilayer structures are twisted with each other.

16. The shielding apparatus of claim 12, wherein the first elongated conductive multilayer structures comprise at least one non-conductive layer, and wherein the second elongated conductive structure comprises at least one non-conductive layer.

17. The shielding apparatus of claim 12, wherein the first conductive filament comprises one or a combination of nickel or aluminum, and wherein the second conductive filament comprises one or a combination of nickel or aluminum.

18. A shielding mesh structure, comprising:
a plurality of conductive yarns, wherein the conductive yarns are interwoven to form the shielding mesh structure;
wherein each of the conductive yarns comprises a plurality of conductive filaments, and wherein each of the conductive filament has its own outer surface;
wherein a number of the conductive filaments in each of the conductive yarns is at least 20;
wherein the shielding mesh structure is configured to provide electromagnetic shielding for an object enclosed by the shielding mesh structure.

19. The shielding mesh structure of claim 18, wherein the shielding mesh structure is configured to be deformed to fit a shape of the object.

20. The shielding mesh structure of claim 19, further comprising an opening configured to allow the object to enter the shielding mesh structure, wherein the shielding mesh structure has an enclosed space to enclose the object when the opening is closed.

* * * * *